US007772851B2

(12) United States Patent
Al-Anbuky et al.

(10) Patent No.: US 7,772,851 B2
(45) Date of Patent: Aug. 10, 2010

(54) BATTERY FLOAT MANAGEMENT

(75) Inventors: Adnan Al-Anbuky, Christchurch (NZ);
Phillip Hunter, Christchurch (NZ)

(73) Assignee: Eaton Power Quality Company,
Christchurch (NZ)

( * ) Notice: Subject to any disclaimer, the term of this patent is extended or adjusted under 35 U.S.C. 154(b) by 714 days.

(21) Appl. No.: 10/568,260

(22) PCT Filed: Jul. 2, 2004

(86) PCT No.: PCT/NZ2004/000141
§ 371 (c)(1),
(2), (4) Date: Aug. 11, 2006

(87) PCT Pub. No.: WO2005/013409
PCT Pub. Date: Feb. 10, 2005

(65) Prior Publication Data
US 2007/0080668 A1 Apr. 12, 2007

Related U.S. Application Data

(60) Provisional application No. 60/484,571, filed on Jul. 2, 2003.

(51) Int. Cl.
*G01N 27/416* (2006.01)
(52) U.S. Cl. ........................ 324/430; 324/429
(58) Field of Classification Search ............... 324/429, 324/430
See application file for complete search history.

(56) References Cited
U.S. PATENT DOCUMENTS
3,857,087 A 12/1974 Jones
(Continued)

FOREIGN PATENT DOCUMENTS
CN 1145536 A 3/1997
(Continued)

OTHER PUBLICATIONS
"Study on Electrode Polarization in Discharge Process of Nickel-Metalhydride Battery," Chinese Journal of Rare Metals, No. 1, Dec. 31, 1999.
(Continued)

*Primary Examiner*—Edward Tso
*Assistant Examiner*—Samuel Berhanu
(74) *Attorney, Agent, or Firm*—Myers Bigel Sibley & Sajovec, P.A.

(57) ABSTRACT

The invention relates to a new VRLA battery float model. The model covers the steady state and transient float charge behavior of both positive and negative electrodes. Backup analysis verifies the internal polarization distribution for a conventional 2V-cell polarization behaviors can be identified without the need for a physical reference electrode. The estimated individual electrode polarization allows early detection of common failure modes like negative plate discharge as well as a reference for float voltage optimisation. Furthermore, the positive polarization relating to minimum grid corrosion may be correlated with the occurrence of the peak of a "Tafel" like resistance used by the model. The model encourages utilisation of low signal perturbation for testing a cell's state of health and state of charge conditions while at float.

8 Claims, 10 Drawing Sheets

U.S. PATENT DOCUMENTS

| | | | |
|---|---|---|---|
| 4,331,699 A * | 5/1982 | Suzuki et al. | 427/8 |
| 5,214,385 A * | 5/1993 | Gabriel et al. | 324/434 |
| 5,250,904 A | 10/1993 | Salander et al. | |
| 6,532,425 B1 | 3/2003 | Boost et al. | |
| 2002/0060555 A1* | 5/2002 | Finger | 320/137 |
| 2003/0210056 A1 | 11/2003 | Arai et al. | |
| 2004/0091777 A1* | 5/2004 | Lam et al. | 429/225 |
| 2004/0101747 A1* | 5/2004 | Bushong et al. | 429/163 |

FOREIGN PATENT DOCUMENTS

WO     WO 98/53335     11/1998

OTHER PUBLICATIONS

Huet, F. *A Review of Impedance Measurements for Determination of the State-of-Charge or State-of-Health of Secondary Batteries*; Journal of Power Sources 70 (1998) 58-69.

\* cited by examiner

Transition of Bulk Storage and
Overcharge Capacitance Values

Electrolyte Specific Conductance as a Function of Specific Gravity a) 25 Hours b) 25 Minutes Transient response, 1A discharge from float.

BATTERY FLOAT MANAGEMENT

RELATED APPLICATIONS

The present application is a 35 U.S.C. §371 national phase application of PCT International Application No. PCT/NZ2004/000141, having an international filing date of Jul. 2, 2004 and claiming priority to U.S. Provisional Application No. 60/484,571, filed Jul. 2, 2003, the disclosures of which are incorporated herein by reference in their entireties. The above PCT International Application was published in the English language and has International Publication No. WO 2005/013409.

FIELD OF THE INVENTION

This invention relates to float to charge behaviour of batteries, and has particular application to valve regulated lead acid (VRLA) batteries.

BACKGROUND

A continuous power supply is critical to the success of many applications. Telecommunications systems are a prime example of this, as they are expected to function continuously in the event of a power outage. A typical telecommunication power system converts the AC grid power to 48 volts DC, and then uses this to charge storage batteries and supply the load. In the event of a disruption to the AC grid power, critical plant is supplied directly from the storage batteries. Depending on the load size and required backup time, large amounts of energy storage are often necessary. Lead acid batteries are traditionally used as the storage element due to their relatively low costs, high energy density, and reliability.

However there has been a recent trend towards the use of valve regulated lead acid (VRLA) batteries due to perceived savings from reduced maintenance and ventilation requirements. The chemistry of a VRLA battery is the same as a conventional flooded lead acid battery, but the physical construction of a VRLA battery has been optimised to allow the gases produced during overcharge to be recombined back into water. Addition of water to replace that lost through gas venting is therefore not required (or possible) with a VRLA battery. In situations where there is a reliable AC power supply, years can pass before the power supply might be interrupted. During this time the storage batteries must be maintained in a fully charged state. All lead acid batteries have a natural self discharge, so a float charge must be supplied in order to maintain the battery in a fully charged state. Constant voltage float charge is normally recommended, and may be specified as a function of the battery temperature.

Float charging has two primary goals:
1) Ensuring the battery remains fully charged indefinitely; and
2) Maximising the life of the battery by maintaining ageing effects at minimum levels.

To ensure that a cell remains fully charged, both electrodes within the cell must be sufficiently polarised (raised above their fully charged open circuit rest potential). To maximise the life of a VRLA cell, grid corrosion and gas loss (venting) must be minimised. The traditional failure mechanism of lead acid batteries is excessive corrosion of the positive grid. The grid forms a low resistance path within the electrode, allowing large currents to be drawn from it. Grid corrosion reduces the cross-sectional conductor area, which increases its resistance. Eventually this resistance rises to a point where the cell can no longer supply the necessary current at the required terminal voltage. At this point the cell is said to have reached the end of its life. Due to the potentials involved, possible grid corrosion can never be completely eliminated, but it can be optimised to ensure the lowest possible rate. It is commonly accepted that the rate of positive grid corrosion is a function of the polarisation on the positive electrode, and has a minimum rate occurring at polarisation slightly greater than the open circuit rest potential. While there is some debate on the actual voltage at which the grid corrosion minima occur, a window of acceptable grid corrosion generally occurs between 40 and 80 mV. The polarisation associated with minimum grid corrosion may vary with cell chemistry.

A typical fully charged open circuit rests voltage for a VRLA cell is 2.14 V. For such a cell a float voltage of 2.27 V may be recommended. At this float voltage, a total polarisation of 130 mV must exist. If, for example, the optimal positive electrode polarisation for minimum corrosion exists at 50 mV, the need of electrode must be in support the remaining polarisation of 80 mV. As both electrodes are raised above their open circuit potentials, the primary goal of the charge will also be satisfied, and the cell will be maintained in a fully charged state indefinitely.

Traditionally an optimal (recommended), float charge voltage is determined on sample cells in a laboratory with the aid of a reference electrode. This recommended float voltage is then applied (largely unchecked) to cells in service in the field. A further complication is that 2 Volt cells are connected in series to produce the desired system voltages (typically 24 or 48 Volts). A single supply is then used to charge the series connected cells. Small differences between cells (resulting from manufacturing variance) may produce a distribution of cell voltages, despite all cells receiving an identical float current due to the series connection.

There is an industry trend towards reducing battery maintenance, so longer life batteries are desirable. However it is becoming increasingly apparent with many "long life" VRLA batteries that either poor design, or poor quality manufacturing, results in the cells failing prematurely in the field. This is believed to be due to internal electrode balance problems, and in particular negative plate discharge. As grid corrosion is the traditional failure mechanism, an obvious way to improve the battery life is to reduce the rate of grid corrosion. This may be achieved by altering the grid alloy. However for balanced float charge operation, the current associated with corrosion of the positive grid must balance the current associated with (impurity related) hydrogen evolution at the negative electorate. If the grid corrosion rate is reduced and purity of the negative electrode is not appropriately increased, polarisation of the negative electrode must decrease to supply current for hydrogen evolution. If the current associated with the hydrogen evolution at the negative electrode is sufficiently large when compared to the current consumed through positive grid corrosion, the entire applied polarisation will be supported by the positive electrode. A gradual discharge of the negative electrode must result in order to supply the current required for hydrogen evolution. While this rate of negative electrode discharge is extremely low, the cumulative effects of months or years of float charge can be significant. Furthermore, as the applied polarisation is supported entirely by the positive electrode, increased rates of grid corrosion, gassing, and possible dryout must result.

Analysis and subsequent optimisation of the float charge relies heavily on knowledge of the polarisation distribution between the positive and negative electrodes within a cell. Conventionally, an optimal float charge is determined by the cell manufacturer and supplied virtually unmonitored to all cells of that type in field use.

However, due to the importance polarisation plays in float charge optimisation, a number of schemes have been published that use varying designs of reference electrodes in cells for float polarisation analysis and subsequent control purposes. Examples include U.S. Pat. No. 3,657,639 (Willihnganz), U.S. Pat. No. 4,935,688 (Mistry), and U.S. Pat. No. 6,137,266 (Chalasani). Without exception, all of these systems require cell modifications to facilitate the use of the reference electrode or reference cell. As VRLA cells basically function as a sealed unit, it is difficult to insert the reference electrode without disturbing the seal and modifying the cells' characteristics.

OBJECT

It is an object of the invention to provide VRLA battery float charge models, methods or apparatus which ameliorate one or more of the disadvantages set forth above, or to at least provide a useful alternative.

BRIEF SUMMARY OF THE INVENTION

In one aspect the invention provides a method for determining polarisation of an electrode of a VRLA battery, the method including the steps of:
allowing the battery to discharge for a selected period of time, monitoring the battery voltage during the selected period, and from the change in voltage over the selected period, determining the polarisation of the electrode.

The method preferably includes detecting the magnitude of the change in voltage to determine the polarisation of the electrode.

A first change in battery voltage and a subsequent second change in battery voltage may be detected, and the first change can be associated with polarisation of a negative electrode and the second change with polarisation of a positive electrode.

The polarisation of at least one electrode can be compared with an expected polarisation value or range of polarisation values to determine parameters of a float charge to be applied to the battery.

The step of discharging may comprises open circuit charge leakage, or alternatively may comprise closed circuit enforced discharging.

As another alternative the step of discharging may occur as part of a current perturbation applied to the battery. In particular, this may be used to determine the polarisation of the negative electrode.

The difference between the battery voltage prior to discharge and the polarisation detected can be used to determine the polarisation of the other electrode.

In another aspect the invention provides a method of providing a float charge to a VRLA battery, the method including the steps of:
allowing the battery to discharge for a selected period of time, monitoring the battery voltage during the selected period, and applying a float charge to the battery dependent on the change in battery voltage over the selected period.

In yet a further aspect the invention provides a method of providing a float charge to a VRLA cell, the method including the steps of:
determining the peak Tafel equivalent resistance for the cell and applying a voltage to the cell electrodes dependent on the determined equivalent resistance.

In another aspect the invention provides a method of modelling a VRLA cell, the method including the steps of:

simulating a capacitance corresponding to a float region of cell operation of a positive electrode of the cell,
simulating a capacitance corresponding to a float region of cell operation of a negative electrode of the cell.

The capacitances are preferably simulated as dual value capacitors, one value corresponding to the bulk charge capacity of the cell and the other value corresponding to the float region.

The method may further include simulating a variable resistance for at least one electrode and varying the resistance to simulate a Tafel characteristic of the electrode.

In another aspect the invention provides a method of modelling a VRLA cell, the method including simulating a dual value capacitance, one value corresponding to a float region of cell operation and the other value corresponding to a bulk charge storage capacity of the cell.

One dual value capacitance may be simulated in relation to a positive cell electrode and another simulated in relation to a negative cell electrode.

The invention also provides a method of estimating the useful life of a VRLA battery, and a method of assessing the state of charge of a VRLA battery.

A battery may include one or more cells.

In a further aspect the invention provides apparatus for apparatus for providing a float charge to a VRLA battery, including a processing unit programmed to monitor the battery voltage during a selected discharge period for the battery, and determine a float charge to be applied to the battery dependent on the change in battery voltage over the selected period.

In a further aspect the invention provides apparatus for apparatus for providing a float charge to a VRLA cell, including a processing unit programmed to determine the peak Tafel equivalent resistance for the cell and determine a voltage to be applied to the cell electrodes dependent on the determined equivalent resistance to provide the float charge.

BRIEF DESCRIPTION OF THE DRAWINGS

One or more embodiments of the invention will be described below with reference to the accompanying drawings in which.

DETAILED DESCRIPTION

The invention allows battery float management to be implemented through modelling and sensing the battery positive and negative electrode contributions. Further information relating to the invention and its implementation can be found in the PhD thesis of Phillip M Hunter entitled "VLRA Battery Float Charge: Analysis and Operation" which is incorporated herein by reference. The invention has the advantage that additional hardware is not required. Electrode polarisation can be sent directly from the battery external terminals by the use of software. Knowing the status of electrode polarisation allows the state of charge of their treat identified. Therefore the required action can be implemented to recover balanced charge polarisation before any permanent damage to the battery takes place. The invention may also be used to identify any damage to the battery that has taken place through successive charge or test procedures.

Through modelling the steady state and transient characteristics of each electrode within a cell, a test and analysis technique has been developed that estimates the polarisation distribution within a float charging VRLA cell. While the outcome of this test produces similar information to the obtained through reference electrode testing, the test does not use any form of reference electrode, it may be applied to any standard to VRLA cell without any modification to the cell.

Figure 1:
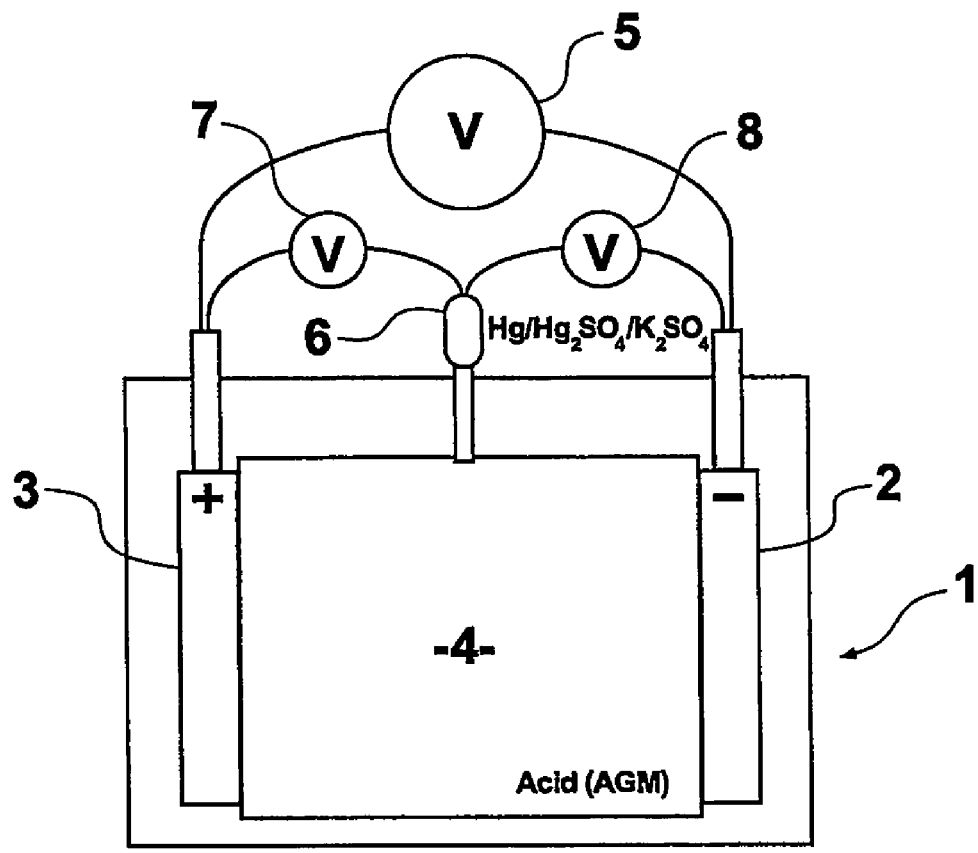
FIG. 1: is a diagrammatic view of a prior art VRLA cell including a reference electrode

Referring to FIG. 1, a known lead acid battery structure is shown diagrammatically, generally referenced 1. The battery consists of at least one cell as shown in FIG. 1 for clarity, but will typically consist of a number of serially connected individual lead acid cells (not shown). The battery has a negative electrode 2 and a positive electrode 3. If the battery comprises a number of cells, then each cell will have a negative electrode and a positive electrode immersed in an electrolyte such as acid 4. In the construction shown diagrammatically in FIG. 1, the potential between the positive and negative electrode can be measured by a voltmeter 5. Also, a reference electrode 6 may be provided to enable the potential between the reference electrode and the positive electrode to be measured using a voltmeter 7 for example. The reference electrode 6 may also be used to enable the potential between the reference electrode and negative electrode 2 to be measured using a voltmeter 8 for example.

As discussed earlier in this document, the use of a reference electrode such as electrode 6 in FIG. 1 provides the benefit that float charge properties of the individual electrodes 2 and 3 may be determined, and this information can be very useful in improving the float charge management of the battery. However, providing an additional electrode is inconvenient and has a number of disadvantages as discussed earlier in this document.

Figure 2:
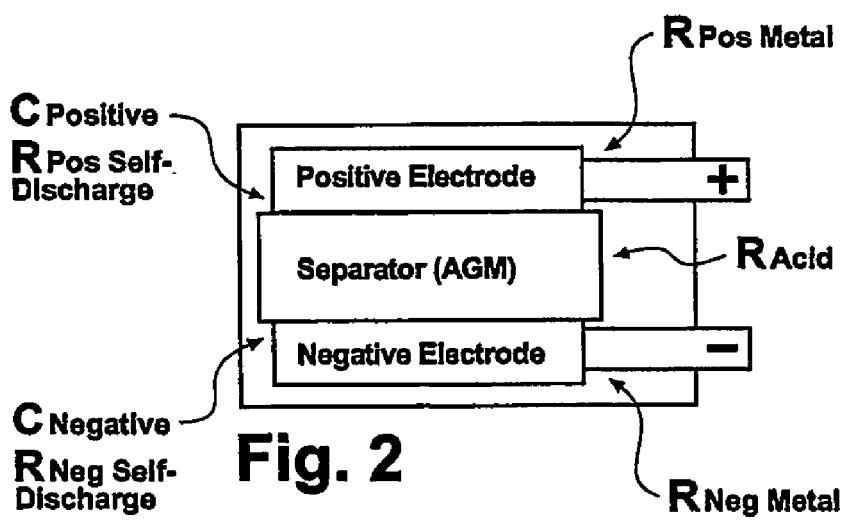
FIG. 2: is a diagrammatic sectional view of a VRLA cell

Referring to FIG. 2, the general battery structure show in FIG. 1 is again represented, but this time without the reference electrode 6. However, in FIG. 2, a number of characteristics of the battery structure are identified. In particular, these are: a resistance associated with the positive electrode (R pos metal); a resistance associated with the negative electrode (R neg metal); a resistance associated with the electrolyte (R acid); a self discharge resistance associated with the positive electrode (R pos self-discharge); a self discharge resistance associated with the negative electrode (R neg self-discharge); a capacitance associated with the positive electrode (C positive); and a capacitance associated with the negative electrode (C negative).

Figure 3:
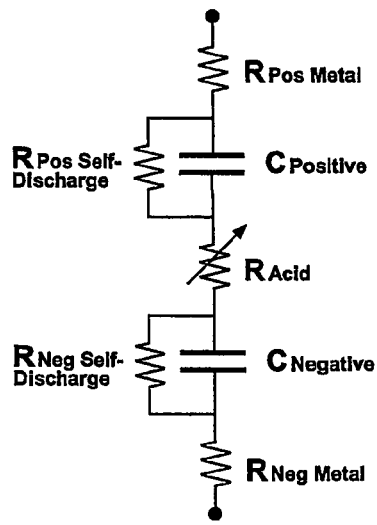
FIG. 3: is a circuit diagram of an equivalent circuit for the cell of FIG. 2
FIGS. 4 and 4A: are further circuit diagrams for the VRLA cell of FIG. 3
FIGS. 5-7: are plots of equivalent overcharge resistance as a function of float current or polarisation for a VRLA battery

The characteristics identified in FIG. 2 are represented in the form of components arranged in a circuit as shown in FIG. 3 which may be used to model (for example using computer software) the battery float charge characteristics.

Figure 4:
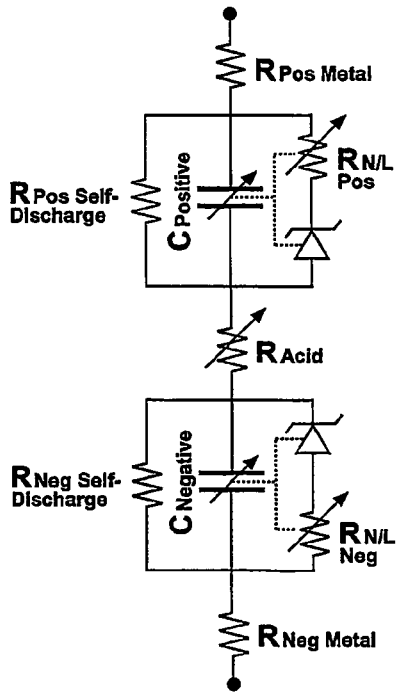
Figure 4A:
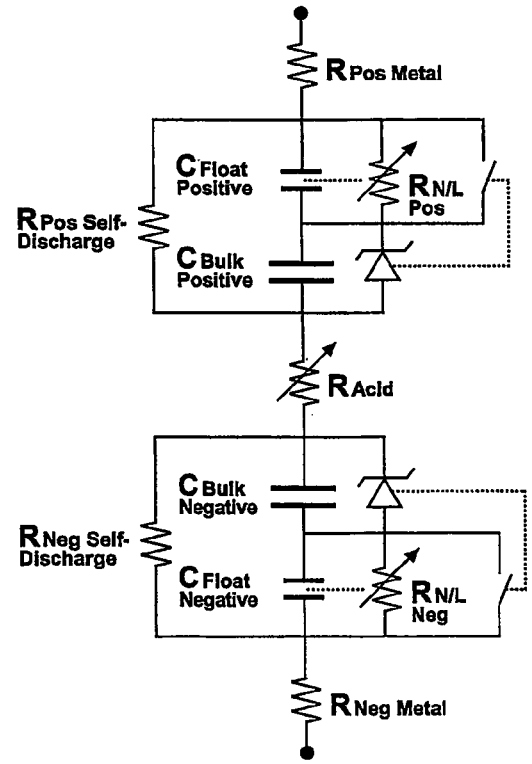

In FIG. 4, a further and more comprehensive model is illustrated. The components referred to in FIG. 3 are also shown in FIG. 4, but with some additional components, which will be described further below. FIG. 4A shows yet another circuit model in which the variable capacitances are replaced by separate bulk capacitors and float capacitors for each electrode.

The models shown in FIG. 3, and FIGS. 4 (most preferred) and 4A, were developed to allow steady state and transient float charge features of both battery electrodes to be modelled. The capacitances C positive and C negative, are shown in FIGS. 4 and 4A as variable capacitors. In this way, the capacitors can have a dual function as representing the bulk capacitance of each electrode in one state and representing the overcharge capacitance of each electrode in another state. Therefore, the variable capacitors "switch" between the bulk and overcharge values. We have found that a smooth transition between values may be achieved through implementation of an appropriate mathematical function.

In practice, MATLAB™ and the MATLAB™ Ordinary Differential Equation (ODE) solver were chosen as the environment for the development and simulation of the VRLA float charge model shown in FIGS. 4 and 4A. We found that this environment had the advantage that it does not have limitations on how components are specified. Component values may be specified as functions of other components, or as functions of the present state (voltage-across or current-through) of other components on the circuit. Similarly, piece-wise modelling can be implemented through the use of "if then," statements. We have found this useful for implementing components such as the zener diodes in the model.

The software for implementing the model is broken into three components: component sizing; model equations; and simulation control. The individual components of the model are described below.

Nonlinear (R n/l pos and Rn/l neg) and Self Discharge Resistors

Figure 5:
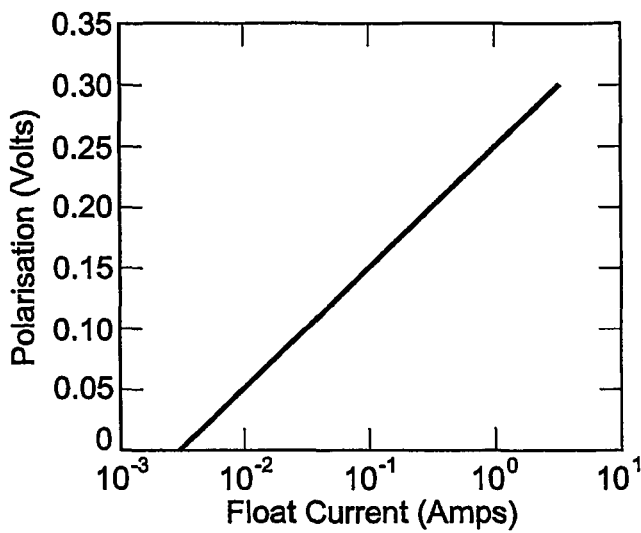
Figure 6:
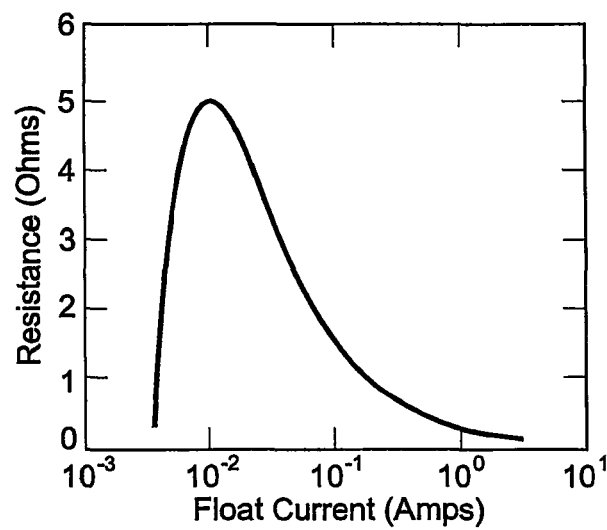

As a Tafel plot represents the steady state characteristic, no net charging or discharging of the cell exists. Virtually all of the energy supplied to the cell through the float charge is consumed in the internal gas cycle. Eventually, this energy must either be dissipated to the atmosphere as heat, or lost through gas venting. As there is no net change in stored energy during steady state float, resistance was chosen as the model component. However, the straight lines of a Tafel plot are produced only when a Linear/log graph is used to plot polarisation against float current. Therefore, the resistance value required to replicate Tafel characteristics must be a function of either the electrodes' polarisation, or the applied float current. The plot of FIG. 5 shows a single Tafel line that has a slope of 100 mV per decade, and a polarisation of 250 mV at a float current of 1 A. In the plot of FIG. 6, the variation in resistance required to produce the Tafel line is shown as a function of float current, while in the plot of FIG. 7 the required resistance is plotted as a function of the electrodes' polarisation.

A Tafel line may be specified through any two of the following: 1) Tafel intercept (current at zero polarisation); 2) Tafel slope; or 3) Polarisation at a point (e.g. 1 A). The relationships between these points are graphically shown in FIG. 8. The component value selection program (vrla_part_size.m) uses the specified float voltage, the float current, the polarisation of the positive electrode at the float voltage, the open circuit voltage, and each electrode's Tafel slope to calculate the polarisations of each electrode at 1 A. By doing this, the location of the positive Tafel line is directly defined by the specified operating point. The location of the negative Tafel line is used to balance the equations concerning the total polarisation supplied to the cell at the float voltage.

Figure 8:
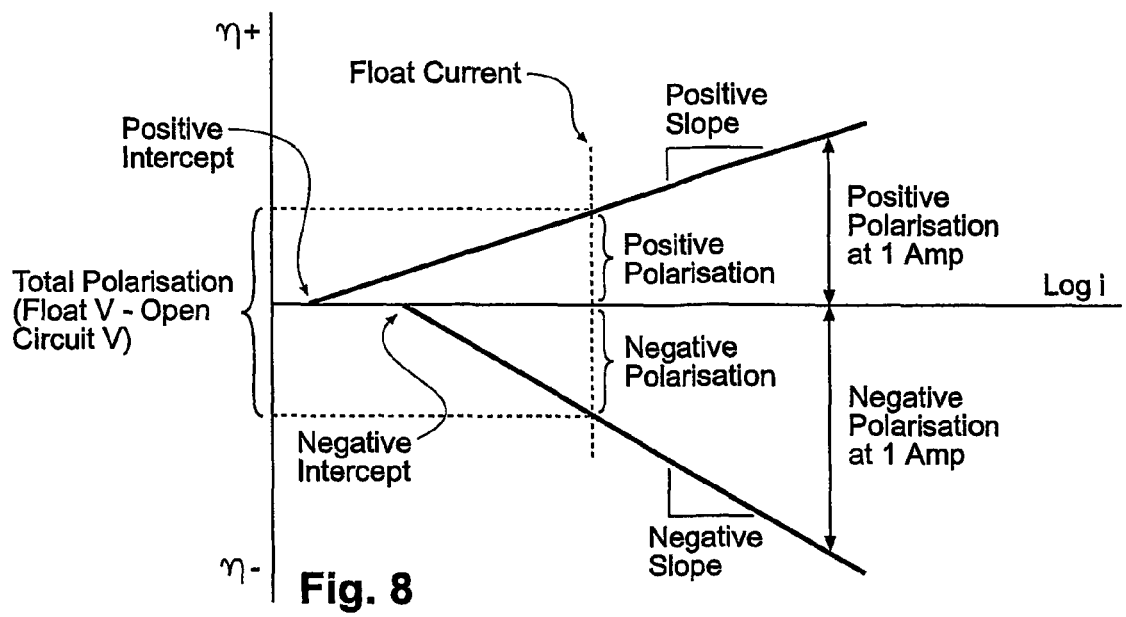
FIG. 8: is a model specification of the overcharge Tafel Characteristic for a VRLA battery
Figure 9:
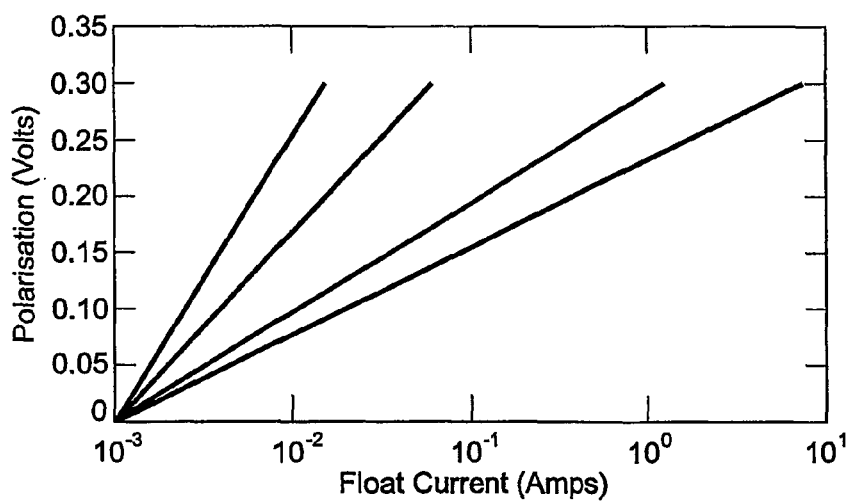
FIGS. 9-12: are plots of variation in equivalent resistance with Tafel slope
Figure 10:
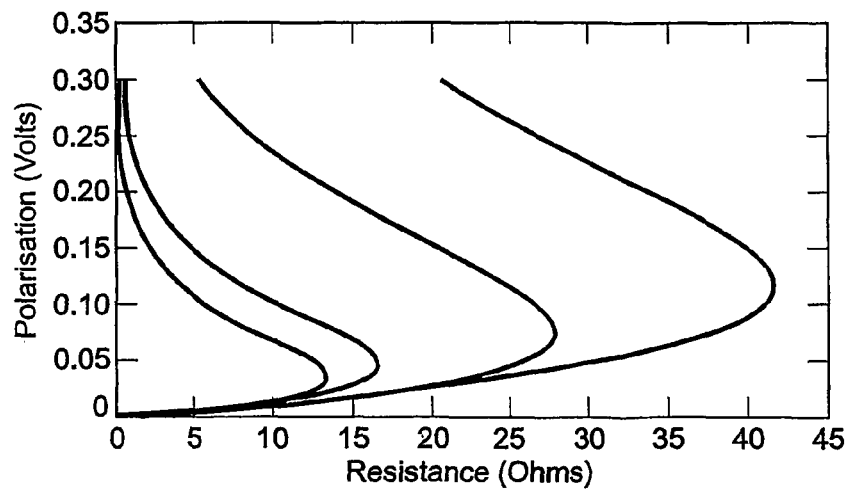

FIG. 8 shows the relationship between the possible variables used to describe a Tafel line and how the required simulation parameters are obtained by the software vrla_part_size.m. The simulation model required the parameters shown in bold (Tafel slope and polarisation at 1 A), while the characterisation (specifying) parameters are shown in italics. Experience has shown that the location of the positive Tafel line is reasonably stable over time, however the location of the negative Tafel line has been seen to drift considerably. The Tafel slopes of each electrode have also been seen to remain reasonably consistent over time.

$$r = \frac{p}{10^{\left(\frac{p-p1}{s}\right)}} \quad 1)$$

where:

$r$ = resistance $p$ = polarisation(volts)

$p1$ = polarisation at 1 $A$(volts)

$s$ = Slope (volts/decade)

Equation 1) shows how the non-linear overcharge resistance is calculated as a function of the polarisation voltage (difference between the capacitor and zener voltages) and the model parameters (polarisation at 1 A and Tafel slope). This function may be easily scaled to represent any desired Tafel line, and was used to produce the polarisation versus resistance curve shown in FIG. 8. Experimental polarisation data may show a slight deviation from a straight Tafel line, especially at low polarisation values. While for most purposes a straight Tafel approximation is satisfactory, if a more precise simulation is necessary Equation 1) may be modified as required.

The value of the self-discharge resistor is selected so that the minimum current required for polarisation (Tafel intercept) is drawn at the point when polarisation begins, i.e.:

$R$self-discharge=zener_voltage/Tafel_intercept_current   2)

Subtracting the capacitor voltage from the diode's zener voltage produces the electrode's polarisation. Ohms law is then used to calculate the current flowing through the non-linear (overcharge) resistor based on the polarisation and the resistance value. Similarly, the capacitor voltage and the self-discharge resistance are used to calculate the self-discharge current. FIGS. 4 and 4A show the self-discharge resistor in parallel with the series connected overcharge resistor and zener diode combination. This is not entirely correct, as the self-discharge resistor should be in parallel with the zener diode. It has been implemented as shown in FIGS. 4 and 4A however, in order to avoid computation problems. At and below the fully charged open circuit voltage, the non-linear overcharge resistor must have no resistance, however this introduces divide-by-zero computation problems. To compensate for the current through the self-discharge resistor during overcharge, this self-discharge current is subtracted from the overcharge resistor current before the differential equations are solved.

Minimum Grid Corrosion Point

Figure 7:
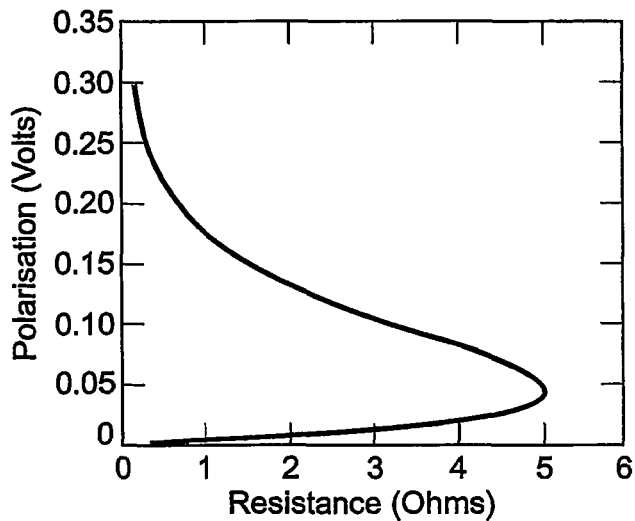

In FIGS. 5 to 7 a voltage- or current-dependant equivalent resistance that replicates Tafel characteristics is shown. While the computation of this equivalent resistance may be achieved with a simple Ohms law calculation at each steady state operating point (voltage-current pair), plotting this equivalent resistance against current or voltage reveals an interesting characteristic. It can be seen in FIG. 7 that there is a peak in resistance at approximately 43 mV. The corresponding Tafel line has a slope of 100 mV per decade and 250 mV of polarization at 1 A. The peak in resistance occurs within the accepted window (40-70 mV) for minimum grid corrosion.

Figure 11:
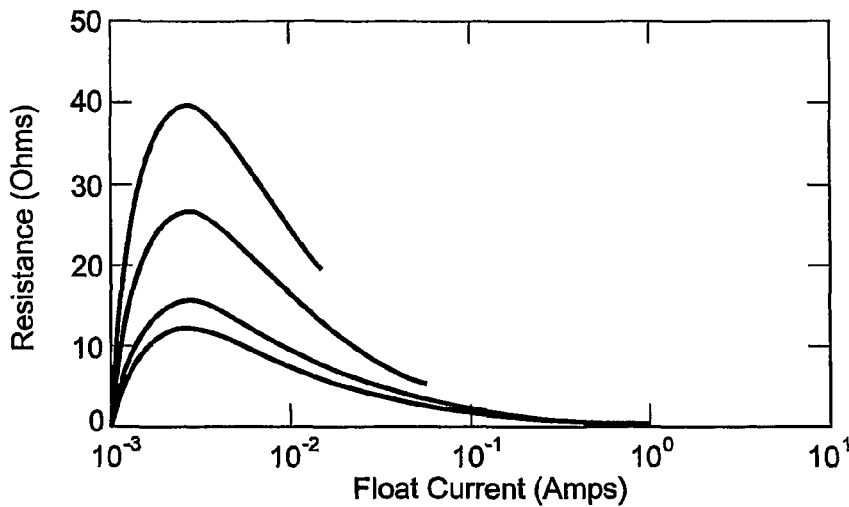

FIGS. 9 to 12 compare the Tafel slopes for oxygen evolution and the corrosion rates of several lead alloys. The Tafel lines have all been normalised to have a zero polarization intercept point at 1 mA. The equivalent resistances required to replicate the Tafel lines have been calculated and plotted against polarisation (FIG. 10), and float current (FIG. 11). The equivalent resistance versus float current plot shows that the current associated with the peak in equivalent resistance remains constant regardless of the Tafel slope. However the polarisation at which the equivalent resistance peak occurs increases with the Tafel slope.

Figure 12:
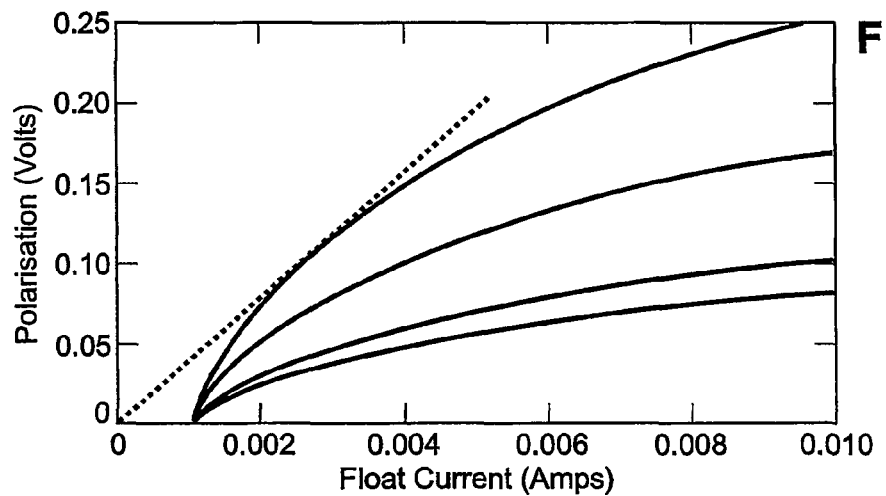
Figure 13:
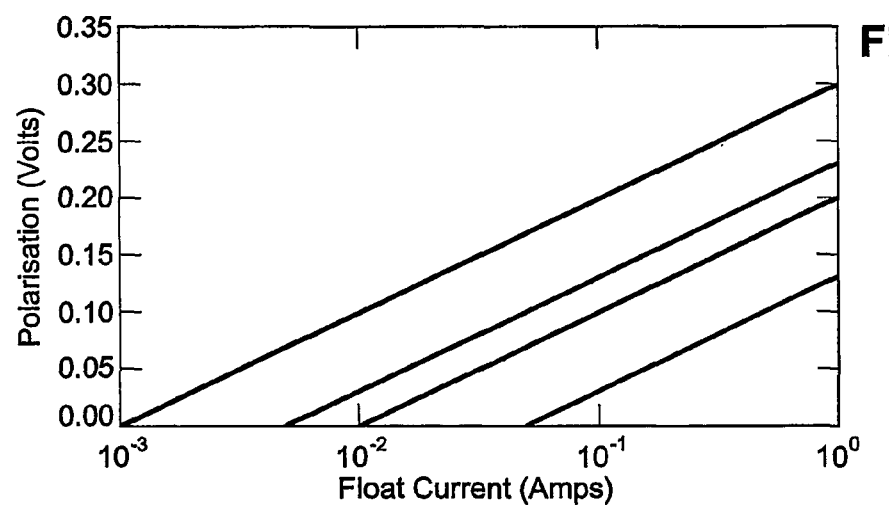
FIGS. 13-16: are plots of variation in equivalent resistance with intercept point
Figure 14:
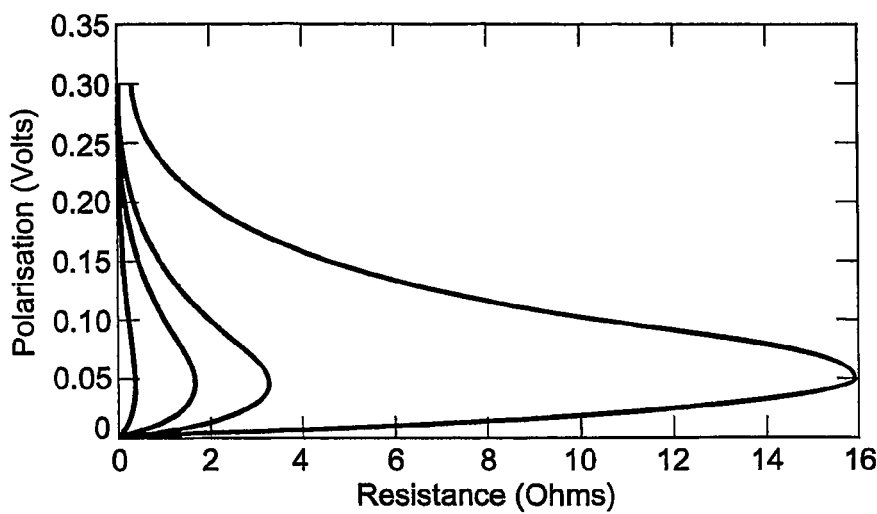
Figure 15:
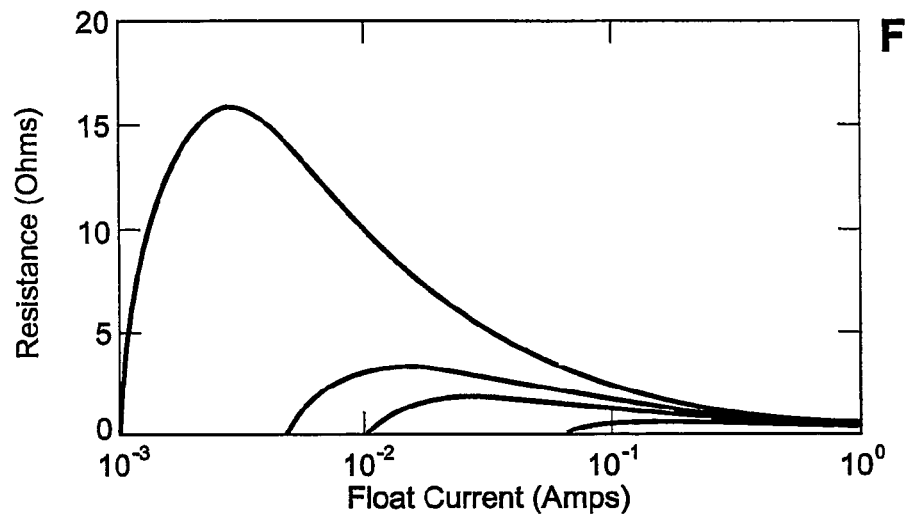
Figure 16:
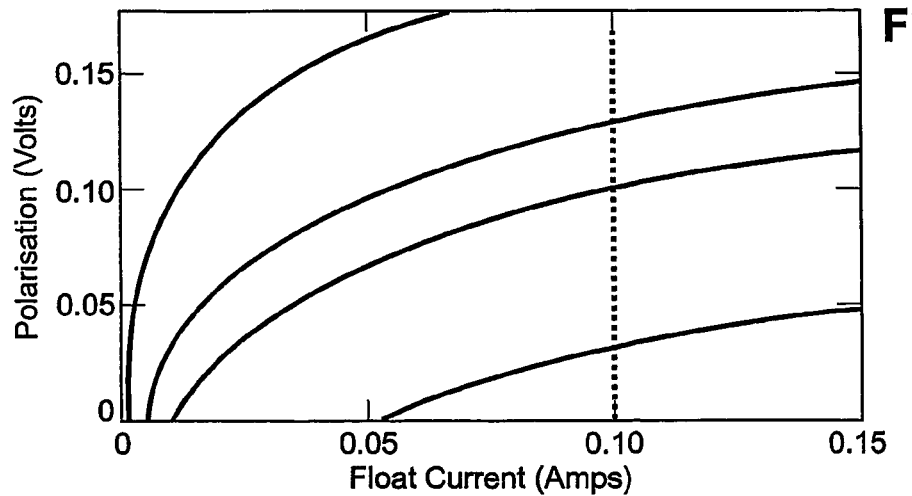

When a linear axis is used to plot the polarisation-voltage/float-current data, the reason for the occurrence of the peak in the equivalent resistance becomes apparent. The same polarization versus float-current data shown in FIG. 9 has been re-plotted in FIG. 12 on a linear axis. With a conventional fixed value resistor, current is a direct function of the applied voltage, and a voltage-current plot of such a resistor will pass through the origin. The bold line in FIG. 12 shows that the point at which a line starting at the origin forms a tangent with the polarisation-current curve corresponds to the peak in the equivalent resistance. At polarisations lower than this tangent point, the curve has a steeper slope, indicating increased resistance, while at polarisations above this tangent point, decreased resistance is indicated by a gradient lower than the fixed resistance.

FIGS. 13 to 16 show four Tafel lines with an identical slope of 100 mV per decade separated by differences in the zero polarisation intercept point. It can be seen in the plot of equivalent resistance versus polarisation (FIG. 14) that despite the differing Tafel intercept point, the polarisation at which the peak in resistance occurs remains constant. The plot of the float current versus equivalent resistance (FIG. 15) shows that the float current at which the peak resistance occurs increases in association with the zero polarisation intercept point.

The Tafel slope determines the polarisation at which the peak in equivalent resistance occurs. The current of this peak is determined by the current at which the zero-polarisation intercept point occurs. In batteries of differing capacities, the float current is expected to increase proportional to the capacity. A Tafel plot of the positive electrode's polarisation would however have the same slope regardless of the cell's capacity.

As the Tafel slope remains constant, the polarisation at which the peak in the equivalent resistance occurs would also remain constant.

As the lowest Tafel slope (i.e. oxygen evolution) dominates the polarisation of the electrode by consuming the most current to support the reaction, the significance of the Tafel plots relating purely to the rates of grid corrosion is reduced. The overall polarisation of the electrode is set through the dominant reaction of oxygen evolution. The current consumed through grid corrosion is determined by the polarisation on the electrode rather than by the current flowing through it. Therefore, as the float current is increased, the change in current consumed through grid corrosion is significantly reduced from that expected by the corrosion Tafel line, despite the grid corrosion Tafel plots having a greater slope.

FIGS. 17 to 20 show the effects of adding grid corrosion currents of 1, 2, and 3 mA to an 80 mV per decade, 1 mA intercept, Tafel line representing the evolution of oxygen. The introduction of a slight curve can be seen at low polarisations, as the corrosion current becomes significant in comparison with the oxygen evolution current. The increase in corrosion current required to produce an increase in polarisation is insignificant when compared to that associated with oxygen evolution. Accordingly Tafel plots are often simplified to a straight Line associated with oxygen evolution, rather than the slight curve seen at low polarisations.

Figure 17:
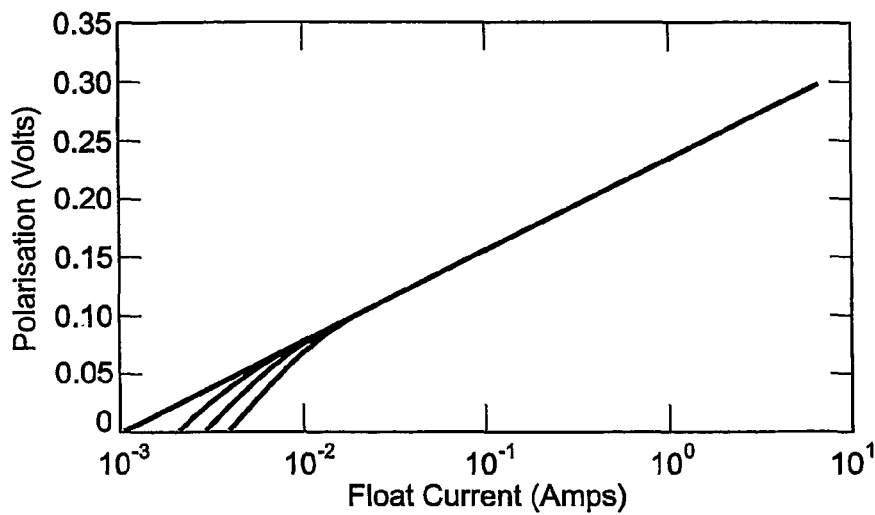
FIGS. 17-20: are plots of variation in equivalent resistance with grid corrosion correction
Figure 18:
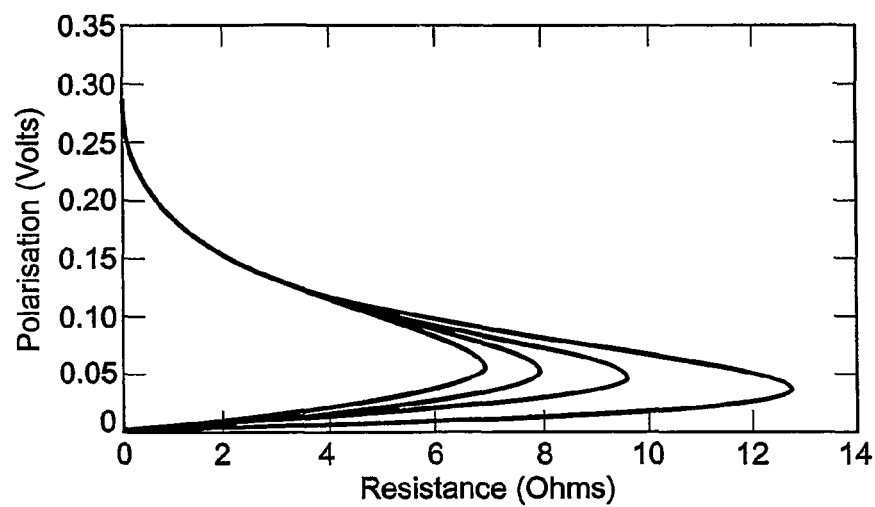
Figure 19:
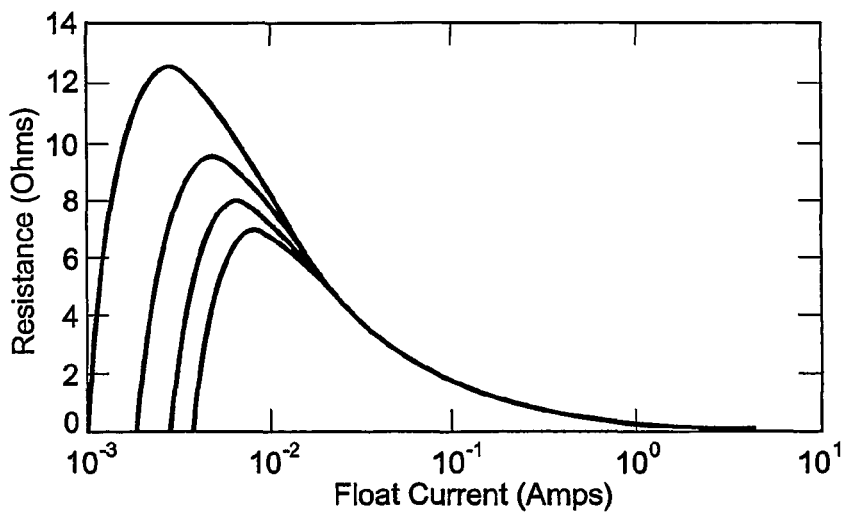
Figure 20:
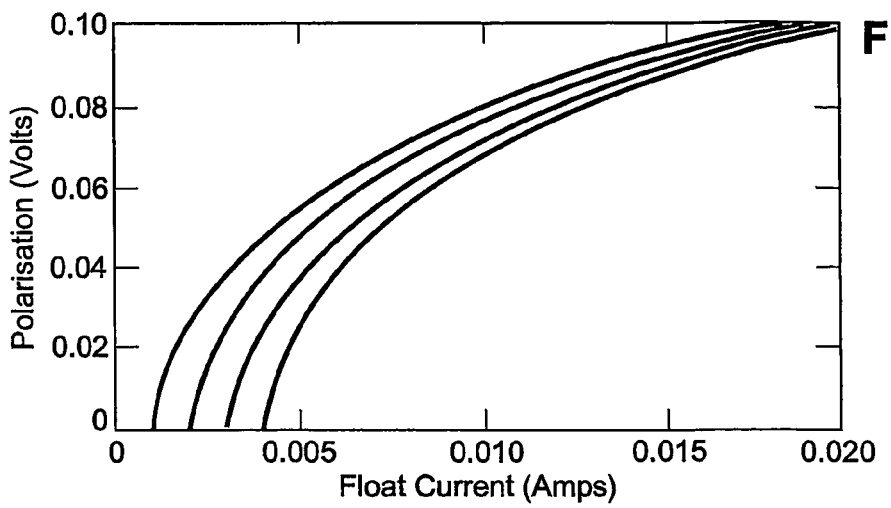

The curved traces in FIG. 17 are characteristic of that expected for the positive electrode (combining oxygen evolution and grid corrosion) in a VRLA battery. Interestingly, the equivalent resistance versus polarisation plot (FIG. 18) has resistance peaks occurring between 35 and 56 mV. The oxygen evolution Tafel slope used to generate these plots was 80 mV per decade. When the same corrosion current levels used in FIGS. 17 to 20 are added to an oxygen evolution slope of 90 mV per decade, the polarisation range associated with the peak equivalent resistance is shifted slightly, and is seen to be 39-63 mV. This range appears very similar to the general range accepted by battery chemists to have minimum corrosion. We believe that the invention allows an optimal or near optimal minimum grid corrosion point to be derived from determining the peak in equivalent resistance.

Energy Storage Capacitors, Bulk and Overcharge

We describe below the energy storage elements required to replicate the transient response of a VRLA cell as it moves from one steady state operating point to another. As some form of energy storage is required to slow the transition from one steady state operating point to the next, and due to the linear voltage decay produced when a constant current is drawn from a cell, capacitors were chosen as the component. The model in FIG. 4 employs a single variable capacitor for each electrode. Effectively, each of these capacitors has two values, one value for the bulk energy storage mechanism associated with the main charge-discharge reaction, and a second value associated with the polarisation transient response, which is significantly smaller.

The size of the total (positive plus negative) bulk storage capacitance is calculated from the voltage difference between the fully charged rest voltage and the discharged rest voltage, the discharge current, and the discharge time (C=i·dt/dv). Assuming that the fully charged and discharged rest voltages are 2.14 and 1.9 V the equivalent capacitance required to represent the bulk storage is approximately 15,000 farads/Ah. Alone, this capacitor representation will produce an uncharacteristic linear voltage decay when a constant current discharge is applied. While this is significantly different to a typical constant current discharge curve, the model is targeted at the overcharge region of VRLA battery operation, and only a basic representation of the bulk storage is required. However, the discharge profile is significantly improved if the variation in the electrolyte resistance is modeled during the discharge, as will be discussed further below.

Furthermore, as only a single capacitor is used to model the bulk storage of each electrode, the reduction in apparent available capacity with increased discharge rate is not modeled. Similarly, the bulk recharge characteristics are not accurately modeled. By applying a current-limited constant voltage recharge, it is expected that the current limit will be exercised until the cell voltage has risen to the charger voltage, and that this voltage will then be maintained as the charge current exponentially decays to the float value. As the bulk storage of each electrode is modeled by a single capacitor, when the float voltage is reached, the current drops directly to that required for float charge. If improved modeling of the bulk discharge and recharge characteristics is required, a distributed capacitor-resistor ladder type circuit may be necessary. This may be optimised to replicate the apparent reduction in available capacity seen in high rate discharges, and also to provide the exponential decay in recharge current when recharging with constant voltage. A distributed capacitor-resistor ladder type circuit should attempt to replicate the mass transport and kinetic limitations within a cell. However, as the developed model is intended for float charge analysis, the basic single capacitor representation of bulk storage at each electrode is sufficient, and requires minimal calibration.

The total capacitance used to model the main charge-discharge reactions must be distributed between the two electrodes. The software vrla_part_size.m, used to calculate the component values for the simulation model, contains a parameter 'pos_bulk_percent' to allow the total bulk capacitance to be split as desired between the positive and negative electrodes. This allows each electrode's voltage-charge ratio and the voltage supported on each electrode to be defined. For example, if the 'pos_bulk_percent' parameter were set to 60, the positive electrode would provide 60% of the cell's voltage, and 60% of the change in the terminal voltage during discharge would be attributed to the positive electrode. As series connection decreases the total capacitance: the distribution of the total bulk-storage capacitor must be such that each electrode produces the desired voltage-change during discharge, and that the series combination of the two capacitors still equals the required total. While the theory of sizing the capacitance of each electrode to produce a desired voltage-change during discharge is valid, the dominant reason for the characteristic shape of the discharge profile is due to an increasing electrolyte resistance. Voltage drops associated with electrolyte resistance overshadow the differences in each electrode's voltage decay. At high discharge rates, the apparent distribution of discharge voltage-change is more heavily influenced by the simulated location of the reference electrode (division of acid resistance) than the actual voltage-change on each electrode. The component value selection software also calculates a voltage offset (to be added to the model's centre, or reference, point). This offset voltage is the difference between the model's centre point voltage (centre of acid resistance) and the voltage that would be produced when a $Hg/Hg_2SO_4/K_2SO_4$ reference electrode is used on a cell in the same charge state. The offset voltage effectively normalises the voltage obtained by the simulated reference electrode as the 'pos_bulk_percent' is altered. The simulated reference-electrode does not reveal the actual voltage supported on each electrode's capacitor. A 'pos_bulk_percent' value of 75% was found to be the most suitable.

Having calculated the total required bulk storage capacitance and an appropriate distribution for each electrode, the capacitors required to produce the overcharge transient response must also be calculated. Due to variance between batteries, no precise method of determining the overcharge capacitor size for each electrode—has been established. However, it has been found that 0.3% of the total bulk storage capacitance is suitable as an initial value for the overcharge capacitance of the positive electrode, and that 0.005% is suitable for the overcharge capacitance associated with the negative.

Figure 21:
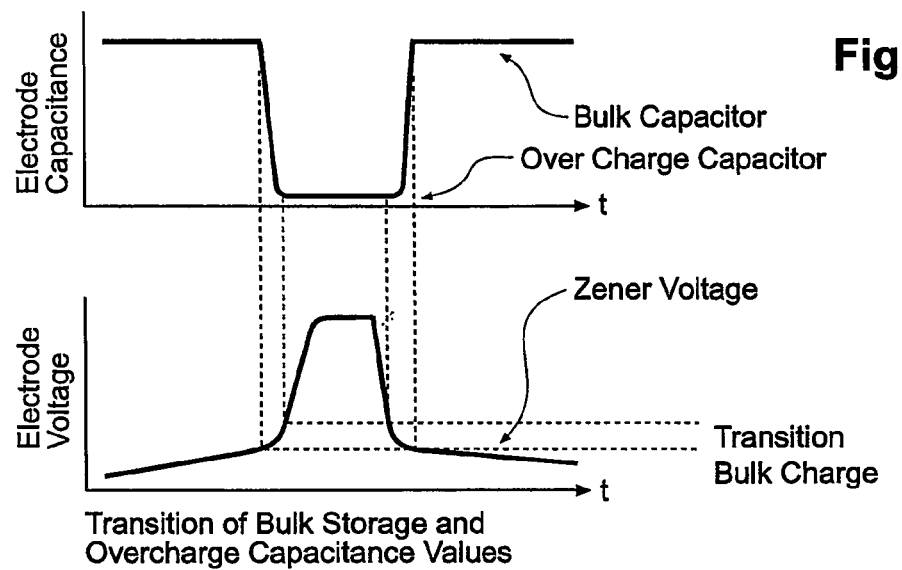
FIG. 21: shows electrode capacitance and electrode voltage against time for transition of bulk storage and overcharge capacitance values

FIG. 21 shows the transition between the bulk storage capacitance and the overcharge capacitance of each electrode. It can be seen that as the electrode voltage rises above the zener voltage, there is a rapid decrease in the capacitance to the overcharge value. To provide a smooth change between the two capacitance values, a transition region has been defined. Below the zener voltage for each electrode, the capacitor has the value calculated for the bulk storage of that electrode. Inside the transition region, the capacitance is a function of the electrode voltage as shown by Equation 3), while above the transition region, the capacitance has the value calculated for overcharge. Suitable transition regions have been found to be 40 mV for the negative electrode, and 10 mV for the positive.

$$C_{trans} = C_{ochg} - 1 + (C_{bulk} - C_{ochg} + 1)^{\left(1 - \left(\frac{V_{cap} - V_{zen}}{V_{trans}}\right)\right)^S} \quad 3)$$

where, $C_{trans}$ = Capacitance during transition $C_{ochg}$ = Overcharge Capacitor Value $C_{bulk}$ = Bulk-Charge Capacitor Value $V_{cap}$ = Capacitor Voltage $V_{zen}$ = Zener Voltage $V_{trans}$ = Transiton Voltage-Range $S$ = Shaping Term (5 was used)

Zener Diodes

The zener diodes in the model are ideal, as when the capacitor voltage is below the zener voltage no reverse current flows through the diode. When the capacitor voltage is above the zener voltage, the current through the diode is determined by the value of the non-Linear overcharge resistor, and the voltage across the same resistor. The voltage at which the zener diode begins to conduct is determined by the relative sizing of the bulk storage capacitors for each electrode. This is determined through the 'pos_bulk_percent' variable in the component value selection software vrla_part_size.m described above.

Acid Resistance

As the electrolyte specific gravity, and hence resistance, does not change considerably in the float charge region of VRLA battery operation, a fixed value of acid resistance is sufficient for float modeling. However, by attempting to provide a more realistic voltage profile during the bulk discharge, the effects of the change in electrolyte resistance during discharge have been modeled. While the model of acid resistance effectively changes the overall resistance, it is still a single element model, and does not attempt to model time dependant quantities such as mass transport, electrolyte gradients, or kinetic properties.

The variation in electrolyte resistance may be largely modeled on the long-standing guideline that the specific gravity of an open circuit cell is the voltage of the cell minus 0.85. As the sum of the voltage on the positive and negative electrodes' bulk-storage capacitors is equivalent to the open circuit voltage, this may be used to determine the specific gravity of the simulated electrolyte. A function is then used to calculate the specific conductance based on specific gravity. This specific conductance is then converted to resistance, and scaled so that the specified fully charged acid resistance is produced at the point at which the cell is fully charged and overcharge begins. As the cell model enters the overcharge region, the electrolyte resistance is held constant at the value specified for the fully charged state.

$$SC = SC_{PK} \times \left( \frac{|SG - C_{PKSG}|^{Shape}}{-1 \times |1 - C_{PKSG}|^{Shape}} + 1 \right) \quad 4)$$

where:

$SC$ = Specific Conductance $SC_{PK}$ = Value of Conductance Peak ~0.76

$SG$ = Specific gravity $C_{PKSG}$ = $SG$ at the Conductance Peak ~1.235

Shape = Curve Fitting Variable ~2.15

Figure 22:
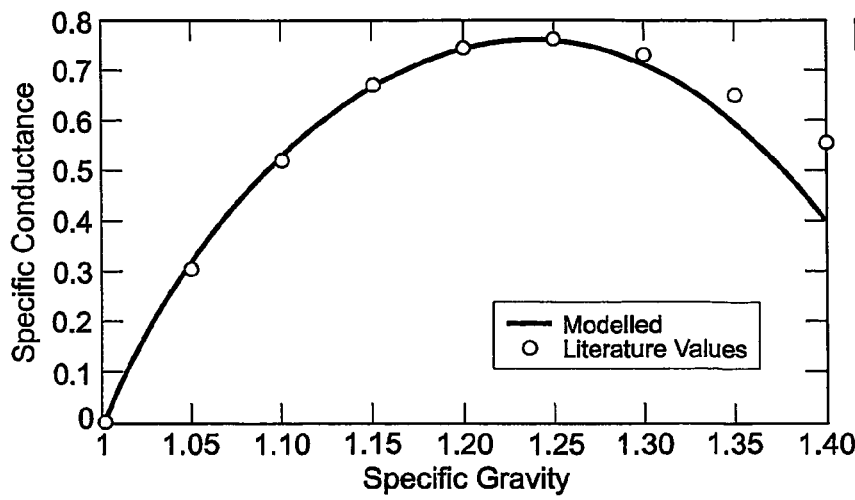
FIG. 22: is a plot of electrolyte specific conductance as a function of specific gravity

Equation 4) shows the function used to calculate the specific conductance of the electrolyte based on the calculated specific gravity. FIG. 22 shows a plot of the function in Equation 4), along with some typical values of specific conductance at 20° C. It can be seen that above a specific gravity of 1.3, the function has some deviation from the literature values, however the specific gravity of the electrolyte used in VRLM cells is typically less than 1.3.

The required value of the fully charged electrolyte resistance must be determined from experience or battery manufacturers' data. However, as this parameter has very little influence on float analysis, a default value of 1 milli-ohm may be used. Generally speaking, the electrolyte resistance will be inversely proportional to cell capacity.

Metallic Resistance

Similar to the electrolyte (acid) resistance, the metallic resistance has very little influence on the float characteristics of a cell. However, for completeness, a single lumped-resistor simulating the effects of the current conducting path (grid) of each electrode has been included in the model.

Default values of 10 micro-ohms have been found to be adequate for simulations. The sum of the acid resistance and the two metallic resistors should equal the internal resistance of the cell.

We have found that the model described can be used to replicate both the steady state and transient responses of a cell's positive and negative electrodes white on float charge. When the responses of each electrode are combined, the overall terminal response of a cell is reproduced. For a given float voltage, the model will draw the same float current as the cell it was modeled on, and for a given float current, the model will produce the same terminal voltage. This is true not only for the steady state levels, but also the transient response, as the model is moved from one steady state operating point to another.

By modeling both electrodes within a cell separately, the terminal response of the cell may be decomposed into the response produced by each electrode without the aid of an additional reference electrode. While this may imply that a well-calibrated model is required, the electrodes' transient responses have been found to be sufficiently different that the model (and associated calibration) is not necessary for certain analyses, such as polarization distribution estimation.

Figure 23:
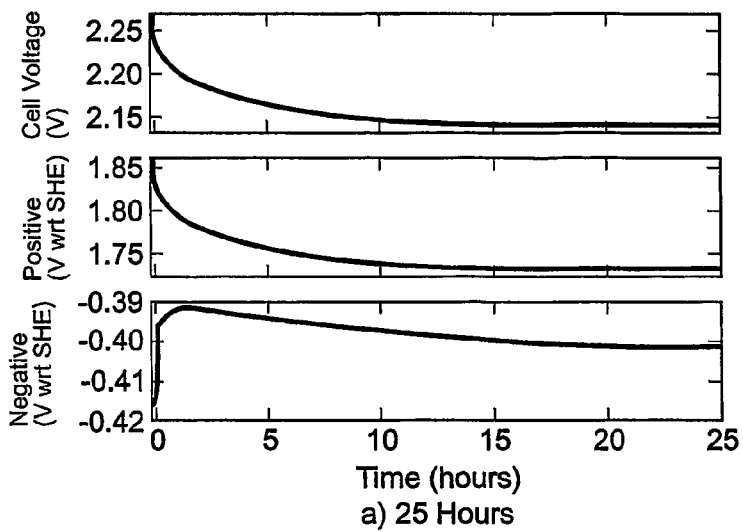
FIGS. 23 and 24: are plots of transient response over a time period of 25 hours and 25 minutes respectively upon removal of float charge
Figure 24:
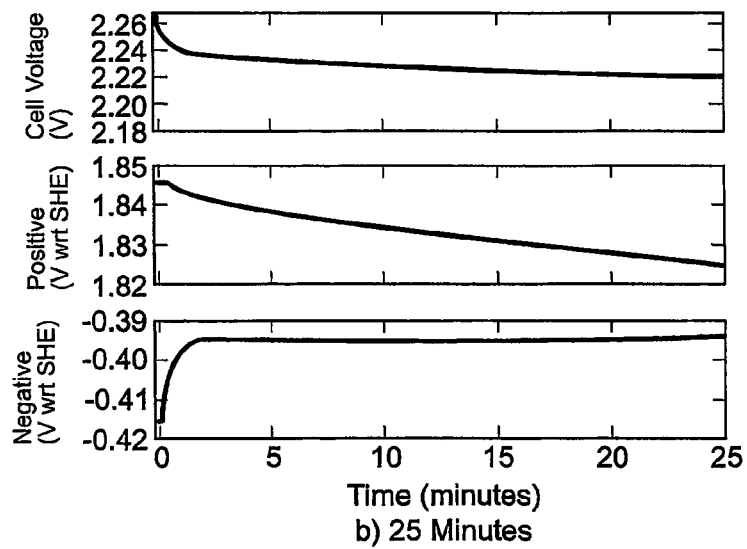

Referring to FIGS. 23 and 24, the voltage response of each electrode in a VRLA cell, and the cell as a whole, is shown as the float charge is removed. It can be seen from FIG. 23 that the cell's voltage takes approximately 24 hours to settle to its open circuit state. From these plots it is evident that the response of the cells voltage is largely due to the response of the positive electrode. The negative has decayed to its open circuit potential in a couple of minutes (FIG. 24). Both the positive and negative electrodes are seen to have exponential-like decays, although the time required for each electrode to decay differs significantly.

Figure 25:
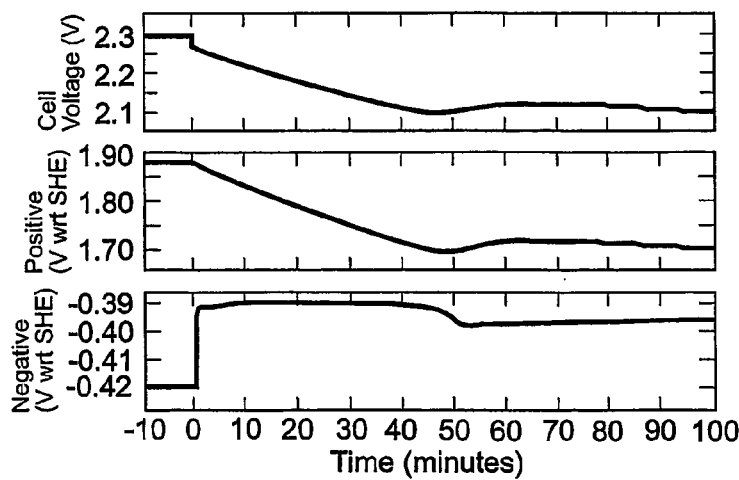
FIG. 25: is a plot of transient response to a 1 A discharge from float

FIG. 25 shows the response of the cell, and of each electrode in the cell, when the float charging cell is discharged with 1 A. As soon as the discharge commences, the negative electrode appears to drop to about its open circuit potential, while the positive takes about 45 minutes. The positive electrode again dominates the cell's decay profile, however as the discharge commences, the step-like response of the negative electrode is clearly evident. Changes In the positive electrode's profile are evident when the open circuit (FIGS. 23 and 24) and the 1 A (FIG. 25) decays are compared. While the natural open circuit decay appears to be exponential, the 1 A discharge has a near linear profile.

Figure 26:
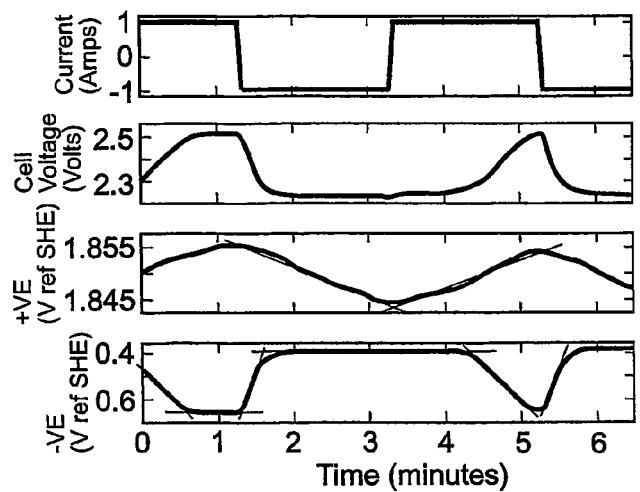
FIG. 26: shows the response to an applied current perturbation of +1 A and −1 A.

FIG. 26 shows the response of a 275 Ah cell on float charge (approximately 200 mA) that has been supplied with an additional +1 A and −1 A current injection. In this instance the cell's response is dominated by the response of the negative electrode due to the frequency of the charge/discharge cycle. Because of the very short time periods involved, there is only a very small change in the potential of the positive electrode. Accordingly, this applied current perturbation may be used to estimate polarization present on each electrode, as will be discussed further below.

FIG. 26 also shows that the basic response of both the positive and negative electrodes can be approximated by a series of straight lines. These may be used to determine the size of float charge capacitors for the model, using the basic formula I=C dV/dt.

The model described above shows that careful analysis of the natural open circuit polarization decay or of a low rate constant current discharge may be used to determine the polarization present on each electrode at the preceding float voltage. As the cell transitions from float charge to its open circuit potential, the time constants associated with the polarization decay of each electrode allow the polarisation present to be estimated. Due to the voltage drops associated with resistive elements within the cell, the analysis should ideally be performed with the natural self-discharge. However, we have found that significant time reductions may be obtained with very low-rate constant current discharges without seriously compromising results.

Figure 27:
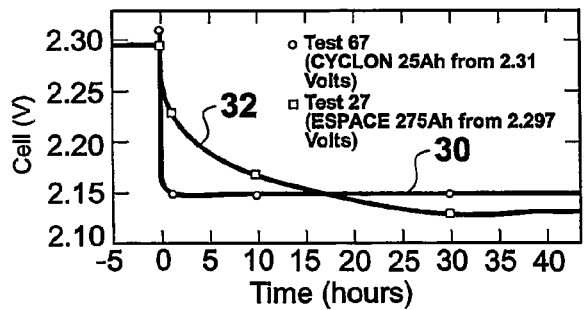
FIG. 27: is a plot showing discharge profile over approximately 50 hours for two different VRLA batteries
Figure 28:
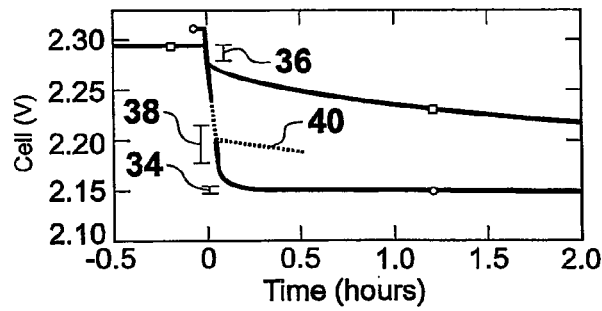
FIG. 28: is a plot of the discharge profile of FIG. 27 over approximately two hours

FIGS. 27 and 28 show the terminal response of two very different VRML a sales as the float charges removed and be decayed to the open-circuit rest potentials. Plot 30 relates to a CYCLON cell (25 Ah from 2.31 Volts), and locus 32 relates to an ESPACE cell (275 Ah from 2.297 Volts). The magnitude of the first drop in each plot indicates the polarization of the negative electrode, while the longer seek and decay indicates that of the positive. It can be seen that the CYCLON sell has virtually no positive electrode polarization as the second decay 34 (lasting approximate three hours) has a very small magnitude. The polarization decay of the ESPACE sell differs considerably. In this case, the initial decay 36 indicates that there is approximately 19 mV (2.297–2.278 V) of negative electrode polarization. The second slower decay of about 35 hours indicates that there is approximately 15 mV (2.278–2.127 V) of positive polarization. As both electrodes of the ESPACE cell had significant levels of polarization at this flight voltage, they should both remain fully charged. However, as positive polarization for this cell is significantly greater than the 40 mV–8-mV window for minimum grid corrosion 38, maximum cell life may not be realized. The optimum voltage profile for minimum preparation is referenced 40 in FIG. 28. the excessive polarization on the positive electrode will also cause an increased rate of overcharge guessing, which may cause gas loss through fencing. Should this occurred, the cell might fail prematurely due to dry out. For maximum life two distinct decays should be visible, and the magnitude of the second (slower) decay should be between approximately 40 mV and 80 mV.

Figure 29:
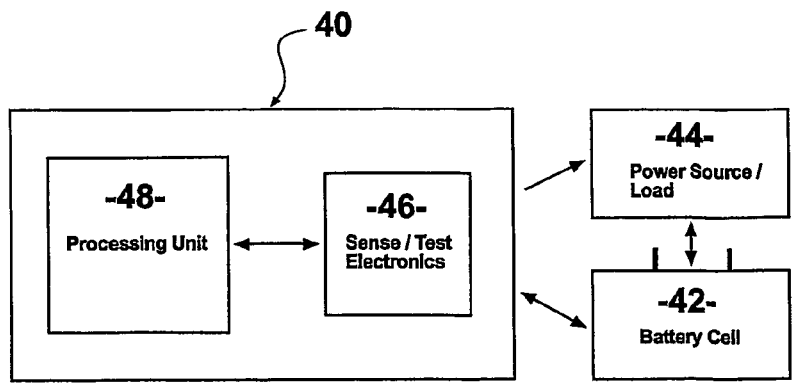
FIG. 29: shows apparatus for testing and/or float charging a battery or battery cell.

Turning to FIG. 29, the invention may be implemented as a battery float charge monitoring or control apparatus generally referenced 40. In practice a battery 42 comprising one or more cells is connected to a load and/or power source 44. The power source is used to apply the float charge to the battery 42. The apparatus 40 includes a sensing unit 46 that may comprise electronic circuitry known to those skilled in the art for controlling the connection of the battery to the power source and load 44, for selectively discharging the battery for test purposes, and for sensing terminal voltage of the battery. The sensing unit 46 provides data from the battery to processing unit 48.

The sensing unit may conduct a test on the battery 42 using one or more of the following methods:
1. Discharge the cell at low rate by lowering the charger voltage (from power source 44) below open circuit voltage
2. Open circuit the battery and allow it to self discharge
3. Introduce a perturbation, for example by having the sensing unit 46 apply a varying current to the battery 42.

The processing unit 48 may be included in a variety of different forms. It could simply comprise a microprocessor, or standalone hardware such as a personal computer. Furthermore, the processing unit could be provided at a remote location. The processing unit will typically play one or more of the following roles:
1. capture the discharged transient from the battery 42 (or the particular cell of the battery which is being tested) and presented it to operator for analysis of electrode polarization contributions.
2. capture the transient, perform analysis of the polarization contribution and reported abnormal conditions based on current conditions and model knowledge.
3. capture the transient, perform analysis of the polarization contribution, calculate and recommend float implementation.
4. work out the float settings for peak positive polarization resistance, as this can provide the most appropriate float I will charge setting for minimum positive grid corrosion.

Therefore the processing unit 48 may include a model derived from that described above (and preferably implemented in software) for the cell or battery which is being tested. Alternatively, unit 48 may include sufficient information about the expected transient decay profile of the particular cell or battery for an appropriate indication of the battery electrode polarization or other parameters to be determined.

Through modeling the steady state and transient characteristics of each electrode within the cell, the invention provides a test and analysis technique that estimates the polarization distribution within a float charging VRLA cell. While the outcome of this test may produce similar information to that obtained through reference electrode testing, the present invention allows a test to be performed without any form of reference electrode, and may be applied to any standard 2 Volt VRLA cell without any modification to the cell.

The developed float charge model may have many alternative users besides the intended assessment of cells on float charge in the field. Some of these users may include provision of simulations for product development and testing, or tracking variations in the cell throughout its life by detailing variations in component values within the developed model. This can allow a tiny indication that the end of battery life is imminent, allow replacement batteries to be purchased prior to the battery failure occurring.

Due to low voltage of a single cell, a number of cells are normally connected in series to form a "string" in order to achieve usable voltages. The float charge model described above may be serially states to simulate the operation of such long strings of sales. Be slightest breed in parameters such as float voltage, current, and polarization may be specified to account for slight differences between sales. This spread in component values may be defined for the best or worst case, or random spread may be simulated within a specified window.

Gathering sufficient information during testing or general battery use allows the model to be accurately calibrated for each cell. Over time, the unchanged model highlights variations in the operational characteristics of the cell, as these change. Recalibration of the model then highlights the components of the model affected by the changes in the cell. Depending on the model components that have altered, the cause of the change can be determined and linked to age, operation, or cell faults.

A number of VRLA cells suffer from electrode polarization problems, the most predominant of which is negative electrode discharge. The invention allows this to be identified, and strategies can be used to minimize this. For example, two courses of action may be available should a cell the proven to be suffering from a gradual discharge of the negative electrode. It must be determined whether that is more beneficial to:

a) raise the float voltage in an attempt to polarize the negative electrode, at the expense of increased positive grid corrosion and possible dry out resulting from gas venting, or b) reduce the float voltage, giving the positive electrode optimal polarization for minimum grid corrosion, and perform regular boost charges to ensure that the negative electrode is periodically fully charged.

The scope of the invention is not limited to the specific embodiments described above. The invention also includes those modifications, additions, improvements, equivalents and substitutions which a person skilled in the art would appreciate are within the scope of the invention and/or which are set forth in the appended claims.

The invention claimed is:

1. A method for determining polarization of an electrode of a VRLA battery, the method including the steps of: allowing the battery to discharge for a selected period of time, monitoring the battery voltage during the selected period, detecting a first change in the battery voltage during the selected period of time and a second change in the battery voltage during the selected period of time, and associating the first change with polarization of a negative electrode and the second change with polarization of a positive electrode, and determining the polarization of the electrode from the associated change in the battery voltage during the selected period of time.

2. A method as claimed in claim 1 including detecting the magnitude of the change in voltage to determine the polarization of the electrode.

3. A method as claimed in claim 1 including comparing the polarization of at least one electrode with an expected polarization value or range of polarization values to determine parameters of a float charge to be applied to the battery.

4. A method as claimed in claim 1 wherein the step of discharging comprises open circuit charge leakage.

5. A method as claimed in claim 1 wherein the step of discharging comprises closed circuit enforced discharging.

6. A method as claimed in claim 1 wherein the step of discharging occurs as part of a current perturbation applied to the battery.

7. A method as claimed in claim 6 wherein the polarization of the negative electrode is determined.

8. A method as claimed in claim 1 further including the step of using the difference between the battery voltage prior to discharge and the polarization detected to determine the polarization of the other electrode.

* * * * *

UNITED STATES PATENT AND TRADEMARK OFFICE
CERTIFICATE OF CORRECTION

PATENT NO. : 7,772,851 B2
APPLICATION NO. : 10/568260
DATED : August 10, 2010
INVENTOR(S) : Al-Anbuky et al.

Page 1 of 1

It is certified that error appears in the above-identified patent and that said Letters Patent is hereby corrected as shown below:

In the Claims:
Column 16, Claim 1, Line 18: Please correct "time, and associating"
to read -- time, associating --

Signed and Sealed this
Eighth Day of February, 2011

David J. Kappos
Director of the United States Patent and Trademark Office